United States Patent
Patel et al.

(10) Patent No.: US 9,275,686 B2
(45) Date of Patent: Mar. 1, 2016

(54) MEMORY BANKS WITH SHARED INPUT/OUTPUT CIRCUITRY

(71) Applicant: LSI Corporation, San Jose, CA (US)

(72) Inventors: Manish Umedlal Patel, Bangalore (IN); Dharmendra Kumar Rai, Uttar Pradesh (IN); Mohammed Rahim Chand Seikh, Bangalore (IN)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 3 days.

(21) Appl. No.: 14/288,575

(22) Filed: May 28, 2014

(65) Prior Publication Data

US 2015/0348594 A1 Dec. 3, 2015

(51) Int. Cl.
G11C 5/02 (2006.01)
G11C 7/06 (2006.01)
G11C 7/12 (2006.01)
G11C 15/00 (2006.01)

(52) U.S. Cl.
CPC .. G11C 5/02 (2013.01); G11C 7/06 (2013.01); G11C 7/12 (2013.01); G11C 15/00 (2013.01)

(58) Field of Classification Search
CPC ............ G11C 5/02; G11C 7/06; G11C 15/00; G11C 7/12; G11C 5/025; G11C 8/12; G11C 7/18; G11C 11/4096; G11C 29/1201; H01L 27/108; H01L 27/10897
See application file for complete search history.

(56) References Cited

U.S. PATENT DOCUMENTS

| | | | |
|---|---|---|---|
| 5,563,820 A * | 10/1996 | Wada et al. ................. 365/63 |
| 5,870,347 A | 2/1999 | Keeth et al. | |
| 5,923,605 A | 7/1999 | Mueller et al. | |
| 5,986,914 A | 11/1999 | Mcclure | |
| 6,728,125 B2 | 4/2004 | Hong | |
| 6,738,279 B1 | 5/2004 | Kablanian | |
| 6,768,692 B2 | 7/2004 | Luk et al. | |
| 6,977,860 B1 | 12/2005 | Tooher et al. | |
| 2002/0153545 A1 | 10/2002 | Tomishima | |
| 2005/0045918 A1 | 3/2005 | Reith | |
| 2006/0120200 A1 | 6/2006 | Pochmuller | |
| 2007/0035992 A1 * | 2/2007 | Curatolo et al. ......... 365/185.02 |
| 2007/0253233 A1 | 11/2007 | Mueller et al. | |
| 2013/0126957 A1 | 5/2013 | Higashitani et al. | |
| 2013/0148415 A1 * | 6/2013 | Shu et al. ..................... 365/154 |
| 2014/0145272 A1 * | 5/2014 | Or-Bach et al. ............. 257/369 |
| 2014/0321217 A1 * | 10/2014 | Song et al. ............. 365/189.02 |
| 2015/0029797 A1 * | 1/2015 | Tao et al. ................. 365/189.06 |

OTHER PUBLICATIONS

Aly et al., "Dual Sense Amplified Bit Lines (DSABL) Architecture for Low-Power SRAM Design, IEEE International Symposium on Circuits and Systems", p. 1650-1653 vol. 2, May 23-26, 2005.*

Mukhopadhyay et al., "Capacitive Coupling Based Transient Negative Bit-line Voltage (Tran-NBL) Scheme for Improving Write-ability of SRAM Design in Nanometer Technologies", IEEE International Symposium on Circuits and Systems, p. 384-387, May 18-21, 2008.*

* cited by examiner

Primary Examiner — Richard Elms
Assistant Examiner — Ajay Ojha

(57) ABSTRACT

A memory cell array includes local input/output logic configured to access memory cells in memory banks. The memory cell array includes inner memory banks disposed in either direction from the local input/output logic. The memory cell array includes outer memory banks disposed beyond the inner memory banks in either direction from the local input/output logic. The memory cell array further includes local bitlines that run in a lower metallization layer of each of the memory banks. The local bitlines of the outer memory banks connect to the local input/output logic via an upper metallization layer across regions of the inner memory banks.

20 Claims, 3 Drawing Sheets

MEMORY BANKS WITH SHARED INPUT/OUTPUT CIRCUITRY

FIELD OF THE INVENTION

The invention generally relates to memory systems, and in particular to a low-power, high-density, and high-speed memory architecture.

BACKGROUND

Memory devices typically include an array of memory cells that are accessed on a grid of rows and columns. For semiconductor memory architectures such as Static Random Access Memory (SRAM) and Dynamic Random Access Memory (DRAM), rows and columns are referred to as wordlines and bitlines, respectively. To decrease capacitance on the bitlines and thereby improve performance of the memory device, a memory cell array may be divided into memory banks that limit the number of rows in each bank. However, previous solutions require a local input/output (I/O) circuit specific to each bank which increases the area overhead of the memory device. Subsequent solutions dispose local I/O circuitry between memory banks so that up to two memory banks, but not more, may share the same I/O circuitry.

SUMMARY

A memory cell array configuration is provided that allows multiple memory banks to share common I/O circuitry. In one embodiment, a memory cell array is disclosed. The memory cell array includes local input/output logic configured to access memory cells in memory banks. The memory cell array includes inner memory banks disposed in either direction from the local input/output logic. The memory cell array includes outer memory banks disposed beyond the inner memory banks in either direction from the local input/output logic. The memory cell array further includes local bitlines that run in a lower metallization layer of each of the memory banks. The local bitlines of the outer memory banks connect to the local input/output logic via an upper metallization layer across regions of the inner memory banks.

The various embodiments disclosed herein may be implemented in a variety of ways as a matter of design choice. For example, some embodiments herein are implemented in hardware whereas other embodiments may include processes that are operable to construct and/or operate the hardware. Other exemplary embodiments are described below.

BRIEF DESCRIPTION OF THE FIGURES

Some embodiments of the present invention are now described, by way of example only, and with reference to the accompanying drawings. The same reference number represents the same element or the same type of element on all drawings.

DETAILED DESCRIPTION OF THE FIGURES

The figures and the following description illustrate specific exemplary embodiments of the invention. It will thus be appreciated that those skilled in the art will be able to devise various arrangements that, although not explicitly described or shown herein, embody the principles of the invention and are included within the scope of the invention. Furthermore, any examples described herein are intended to aid in understanding the principles of the invention and are to be construed as being without limitation to such specifically recited examples and conditions. As a result, the invention is not limited to the specific embodiments or examples described below.

Figure 1:
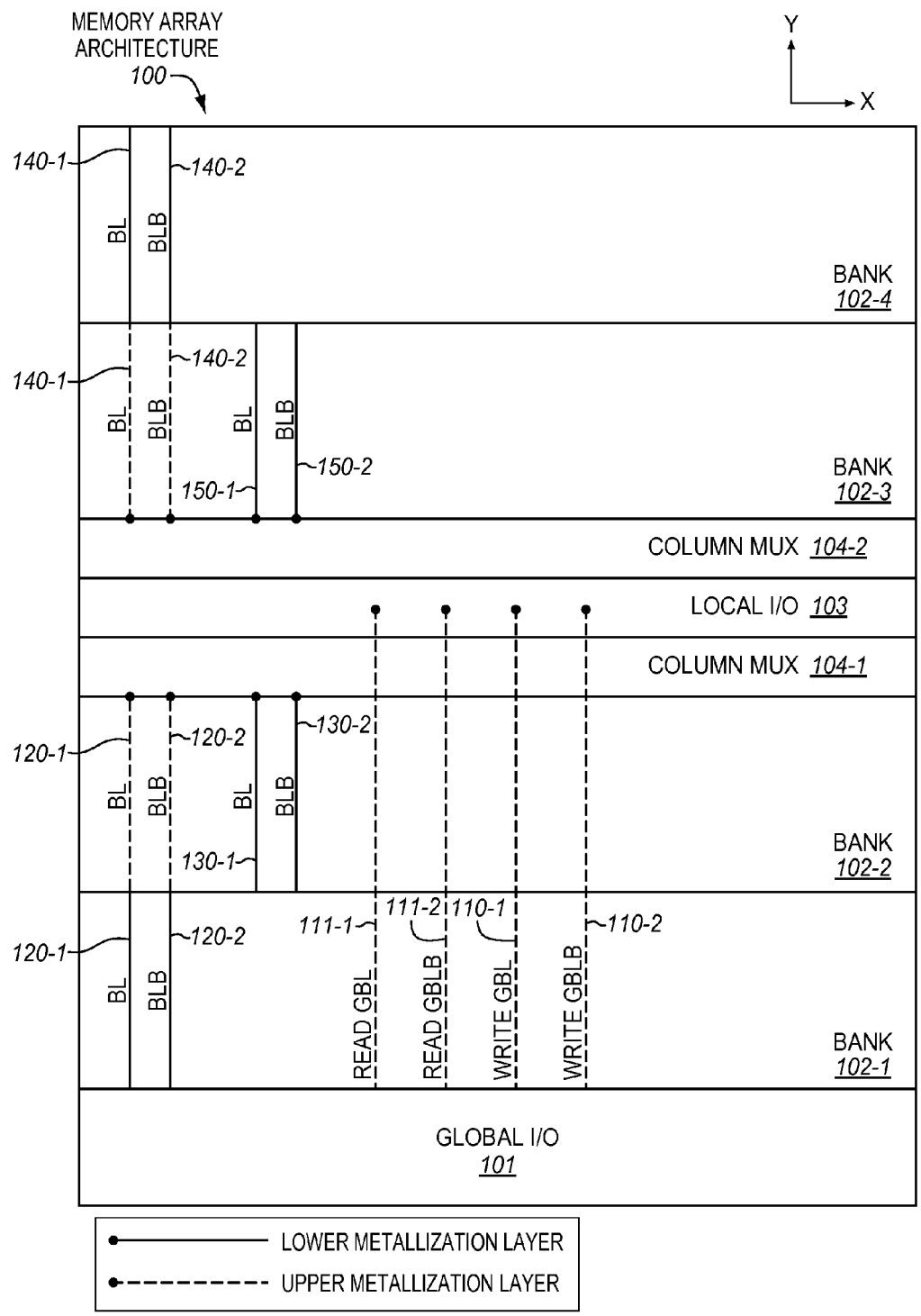
FIG. 1 is a block diagram of a planar view of an exemplary memory array architecture 100.

FIG. 1 is a block diagram of a planar view of exemplary memory array architecture 100. Individual memory cells are disposed in the memory array architecture 100 at intersections of columns and rows. When thought of as x, y, and z orthogonal planes, bitlines run in the y-direction (i.e., column direction) in a horizontal plane, and wordlines run in the x-direction (i.e., row direction) of the horizontal plane. In general, a wordline controls access to a row of memory cells and a bitline carries data to and from a memory cell along a desired column. For ease of graphical representation, individual memory cells and wordlines (and associated circuitry such as a row decoder to activate a selected wordline) are not shown in FIG. 1.

In this embodiment, the memory array architecture 100 includes multiple memory banks 102. Each memory bank 102-1-102-4 includes an array of memory cells. A local input/output (I/O) module 103 directs read/write operations to a memory cell in a given memory bank 102 with a column multiplexer (MUX) 104 that selects a bitline which corresponds with the appropriate memory bank 102 and column where the desired memory cell resides. The local I/O module 103 and column multiplexers 104-1-104-2 may be centered in the column direction of the memory array architecture 100 to decrease bitline length and capacitance and therefore improve access speed to the memory cells.

The memory array architecture 100 is enhanced so that a single local I/O module 103 directs read/write operations for each of the four memory banks 102-1-102-4. As will be described in more detail below, this shared configuration significantly improves area overhead as it reduces the local I/O circuitry compared with previous configurations which use a dedicated local I/O module for each individual memory bank, or which use a local I/O module for memory banks disposed immediately to either side (i.e., circuitry is shared between two memory banks).

The memory array architecture 100 includes a lower metallization layer and an upper metallization layer. In each memory bank 102 local bitlines controlled by the local I/O module 103 run in the lower metallization layer and connect to memory cells for that memory bank 102. In order to connect the local I/O module 103 to memory banks 102 furthest from the I/O module 103 (e.g., memory bank 102-1 and 102-4), the local bitlines traverse from the lower metallization layer to an upper metallization layer (i.e., in the z-direction) to route around the memory cell connections that occur in the memory banks 102 that are in between (e.g., memory bank 102-2 and 102-3).

In this embodiment, each bitline comprises a pair: a true bitline (BL) and a complement bitline (BLB). FIG. 1 shows a portion of a column for each memory bank 102 for ease of explanation, though it is understood that the memory array architecture 100 may comprise many columns. Suppose, for example, that the local bitlines shown in FIG. 1 represent a single column of the memory array architecture 100. As such, the local bitline pair 120, BL 120-1 and BLB 120-2, connect to a column of memory cells of memory bank 102-1 and run in a lower metallization layer across memory bank 102-1, as indicated by the solid line in FIG. 1. At, or near, the boundary between memory bank 102-1 and memory bank 102-2, the local bitline pair 120 routes to an upper metallization layer to cross the memory bank 102-2 region, as indicated by the dashed line in FIG. 1. There are no memory cell connections to the bitline pair 120 in the memory bank 102-2 region. Similarly, the local bitline pair 140, BL 140-1 and BLB 140-2, connect to a column of memory cells in memory bank 102-4 and run in the lower metallization layer across memory bank 102-4. At, or near, the boundary between memory bank 102-4 and memory bank 102-3, the local bitline pair 140 routes to an upper metallization layer to cross the memory bank 102-3 region. There are no memory cell connections to the bitline pair 140 in the memory bank 102-3 region.

Therefore, in the regions of the inner memory banks 102-2 and 102-3, the local bitline pairs 120/140 of outer memory banks 102-1 and 102-4 run in the upper metallization layer vertically above the local bitline pairs 130/150 (e.g., BL 130-1, BLB 130-2, BL 150-1, and BLB 150-2) which run in the lower metallization layer and connect to memory cells in respective memory banks 102-2 and 102-3. Assuming that a single column is shown, the local bitline pairs 120/130 and 140/150 of adjacent memory banks 102 may overlap in the x-direction in the regions of the inner memory banks 102-2 and 102-3. However, this is not shown in FIG. 1 in order to illustrate the metallization layer configuration. The configuration shown allows the local I/O module 103 to access memory in each of the four memory banks 102. In one embodiment, the local bitline pairs 120/140 traverse between different metallization layers via strap cells placed between boundaries of the memory banks 102.

In this embodiment, global bitline pairs 110/111 traverse the memory banks 102 in column-wise fashion in the upper metallization layer, as indicated by the dashed line in FIG. 1. A write global bitline pair 110 comprises a true write global bitline (Write GBL) 110-1 and a complement write global bitline (Write GBLB) 110-2. Similarly, a read global bitline pair 111 comprises a true read global bitline (Read GBL) 111-1 and a complement read global bitline (Read GBLB) 111-2. In one embodiment, the local I/O module 103 toggles read global bitline pair 111 and the global I/O module 101 toggles the write global bitline pair 110 to perform read/write operations on memory cells in the memory banks 102.

Figure 3:
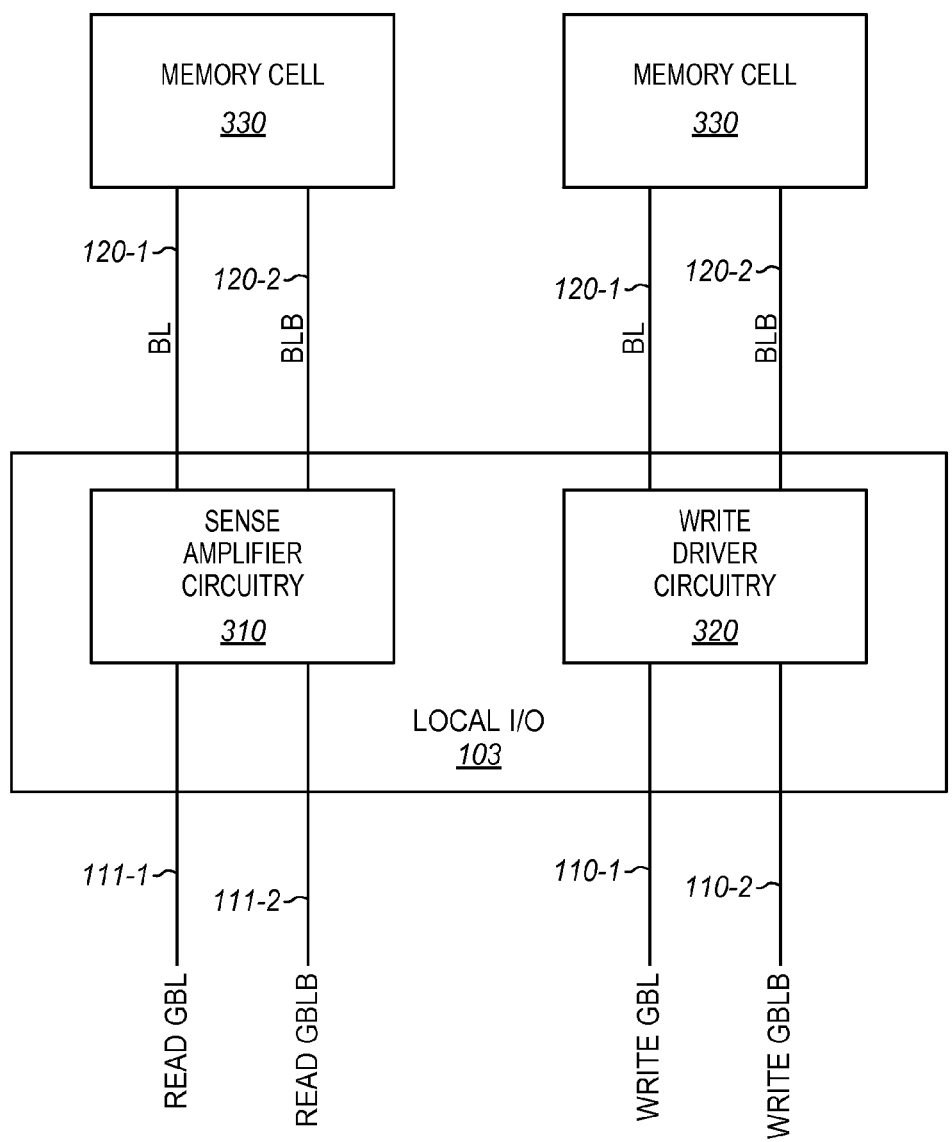
FIG. 3 is a block diagram of a local input-output module in an exemplary embodiment.

FIG. 3 is a block diagram of the local I/O module 103 in an exemplary embodiment. As is shown in FIG. 3, the local I/O module 103 may comprise sense amplifier circuitry 310 and/or write driver circuitry 320. For example, in a read operation of a memory cell (e.g., memory cell 330) in memory bank 102-1, a row address decoder activates a wordline in accordance with the address of the memory cell. The sense amplifier circuitry 310 of the local I/O module 103 detects a slight voltage difference between a true local bitline (e.g., BL 120-1) and its complement (e.g., BLB 120-2) of a column that corresponds with the address of the memory cell due to the activated wordline. The sense amplifier circuitry 310 amplifies the signal and sends it to the global I/O module 101 via the read global bitline pair 111.

In another example, to perform a write operation of a memory cell (e.g., memory cell 330) in bank 102-1, the write driver circuitry 320 of the local I/O module 103 receives a rail-to-rail signal from the global I/O module 101 via the write global bitline pair 110. The write driver circuitry 320 writes the received signal to the local bitlines (e.g., bitline pair 120) that correspond to the column where the desired memory cell resides. At least one additional benefit of the memory array architecture 100 is that the global bitlines 110/111 are shortened and therefore read/write access time is improved because the global I/O module 101 connects to just one local I/O module 103. In prior architectures, global bitlines extend in the column direction (i.e., y-direction) to connect the global I/O module with a series of local I/O modules that are dispersed throughout the array in the same direction.

Figure 2:
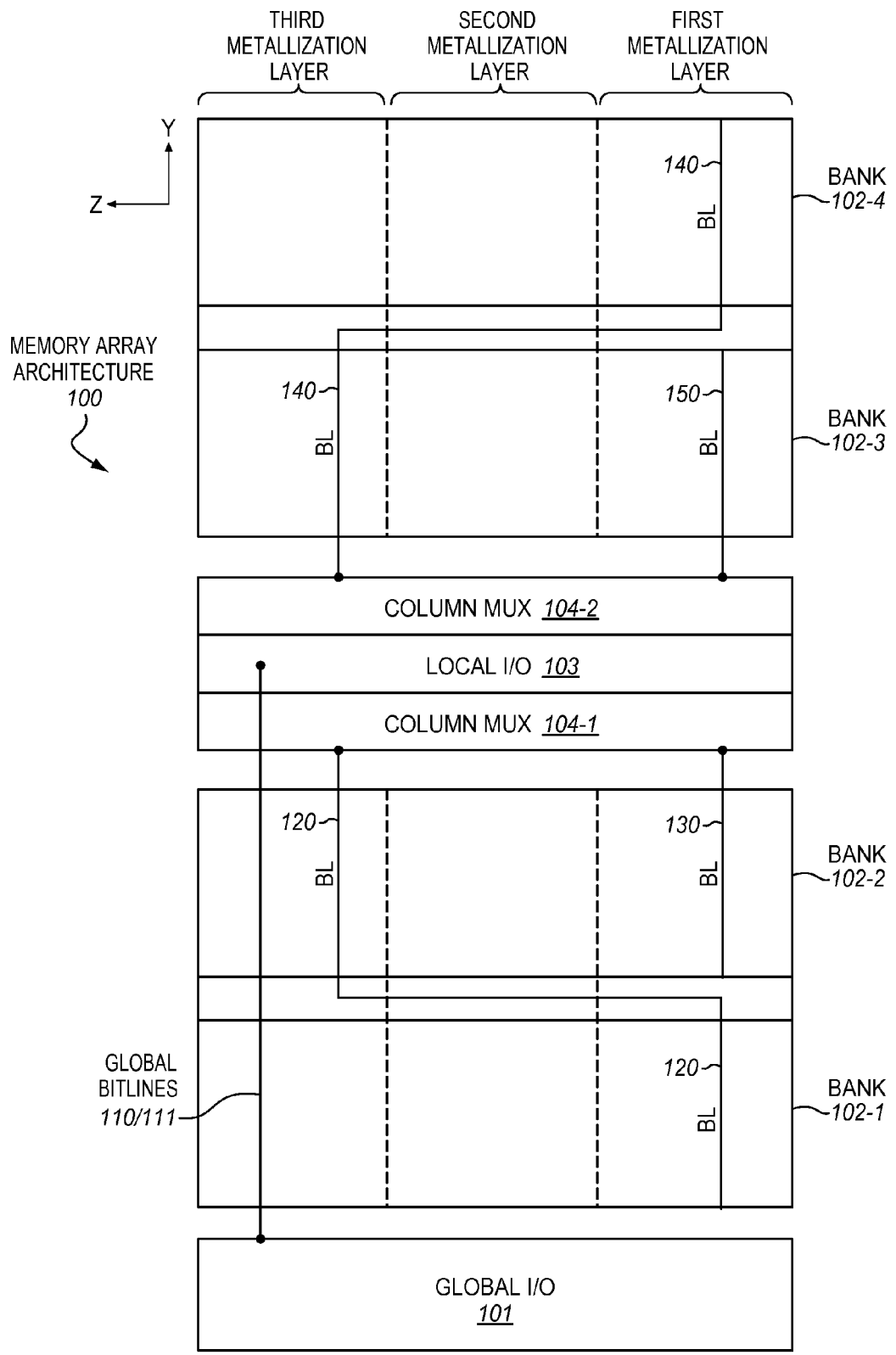
FIG. 2 is a block diagram of a side view of the exemplary memory array architecture 100.

Referring now to FIG. 2, a block diagram of a side view of the memory array architecture 100 is shown in an exemplary embodiment. In this embodiment, the memory array architecture 100 includes a first metallization layer, a second metallization layer, and a third metallization layer. The local bitline pairs 120/130/140/150 run in the first metallization layer and connect to memory cells of respective memory banks 102-1, 102-2, 102-3, and 102-4.

The bitline pairs 120 and 140 of memory banks 102-1 and 102-4, respectively, are taken to the third metallization layer in a boundary area and then traverse across the regions of adjacent memory banks 102-2 and 102-3 in the third metallization layer to connect to the local I/O module 103. In this embodiment, the global bitline pairs 110 and 111 connect the global I/O module 101 to the local I/O module 103 through the third metallization layer. Wordlines (again not shown) couple to the memory cells and run in the second metallization layer. As described above, the memory array architecture 100 advantageously allows the local I/O module 103 to connect to multiple memory banks 102 (e.g., at least two memory banks disposed in one direction from the local I/O module 103).

The wordlines and bitlines may be formed with long metallic or polysilicon traces that are electrically tapped at each array junction where a memory cell has been formed. In addition to the metal-to-ground and metal-to-metal capacitance that the metallic trace routing defines, there is a node capacitance of all the devices (e.g., transistors) that are coupled to an activated row or column. Many memory architecture designs increase the density of memory cells in an array at the expense of increased device capacitance. New memory systems that include multi-gate devices, such as FinFET transistors, as well as memory devices with single-port or multiport SRAM or Content Addressable Memory (CAM), typically have a large device capacitance in comparison with other capacitance sources. The device capacitance is therefore often (and increasingly) described as a bottleneck for improvement to read/write access times for memory devices.

The routing of local bitlines 120/140 from the first metallization layer to the third metallization layer slightly increases metal capacitance due to the increased length. However, the increased metal capacitance is negligible compared with device capacitance, and, in the memory array architecture 100, a higher number of memory cells may be addressed with smaller area overhead (i.e., increased density is realized) without any increase in device capacitance. This is particularly true in embodiments of the memory array architecture 100 that include multi-gate devices, such as FinFET transistors, as well as embodiments where the memory array architecture 100 is a single-port or multiport SRAM or Content Addressable Memory (CAM) device.

The memory array architecture 100 may be part of a variety of other memory devices that store and access information, such as DRAM, programmable ROM (PROM), electrically erasable PROM (EEPROM), Flash memory, single-port, multiport, etc. Those skilled in the art will understand that additional components not shown or described in the figures, such as, latches, decoders, etc. may be used to access memory cells in the memory array architecture 100. The figures are simplified schematic views used to discuss the memory array architecture 100 but do not reflect the manner or in any way limit the physical implementation of the memory array architecture 100.

Furthermore, while described with a particular number and arrangement of memory banks and metallization layers, those of ordinary skill in the art would understand that the features described herein may be applicable to a number of different configurations by matter of design choice. Additionally, those skilled in the art will understand that the embodiments disclosed herein may be applicable to a number of different bitline architectures. Moreover, it will be appreciated that the terms upper, lower, first, second, third and the like in the description are used for distinguishing between similar elements and not necessarily for describing a particular orientation or order. In other words, the terms so used are interchangeable under appropriate circumstances and the embodiments of the disclosure herein can operate in orientations and sequences other than that which is described or illustrated herein.

What is claimed is:

1. A Static Random Access Memory (SRAM) array, comprising:
    a local input/output logic configured to access memory cells in memory banks, coupled with one or more global bitlines;
    inner memory banks disposed in either direction from the local input/output logic;
    outer memory banks disposed beyond the inner memory banks in either direction from the local input/output logic; and
    at least four local bitlines that run in a lower metallization layer of each of the memory banks;
    wherein local bitlines of the outer memory banks are rerouted vertically via an upper metallization layer over and across regions of the inner memory banks to connect to the local input/output logic.

2. The memory array of claim 1, wherein:
    the local bitlines that run in the lower metallization of each of the memory banks connect to memory cells of a respective memory bank; and
    the local bitlines of the outer memory banks in the upper metallization layer do not connect to memory cells in the regions of the inner memory banks.

3. The memory array of claim 1, wherein:
    the local bitlines of the outer memory banks exhibit a higher capacitance than other local bitlines of the memory array.

4. The memory array of claim 1, further comprising:
    the global bitlines, wherein the global bitlines traverse the upper metallization layer and connect the logical input/output logic to a global input/output logic.

5. The memory array of claim 1, further comprising:
    wordlines that traverse in a middle metallization layer and activate respective rows of the memory cells.

6. The memory array of claim 1, wherein:
    the local input/output logic includes sense amplifier circuitry.

7. The memory array of claim 1, wherein:
    the local input/output logic includes write driver circuitry.

8. The memory array of claim 1, further comprising:
    a row address decoder.

9. The memory array of claim 1, wherein:
    the global bitlines comprise at least one write global bitline pair and at least one read global bitline pair.

10. The memory array of claim 1, wherein:
    the memory cells include FinFET transistors.

11. A Random Access Memory (RAM) array, comprising:
    multiple memory banks that each include an array of memory cells, wherein each memory cell in a memory bank is associated with a different combination of row and column within the memory bank, and each memory bank includes local bitlines that traverse a lower metallization layer of the memory bank;
    local input/output logic configured to access memory cells in the memory banks, coupled with one or more global bitlines,
    wherein the memory banks comprise inner memory banks disposed in either direction from the local input/output logic, and further comprise outer memory banks disposed beyond the inner memory banks in either direction from the local input/output logic,
    wherein local bitlines of the outer memory banks are rerouted vertically via an upper metallization layer over and across regions of the inner memory banks to connect to the local input/output logic.

12. The RAM array of claim 11, wherein:
    wherein the local bitlines of the outer memory banks exhibit a higher capacitance than other local bitlines of the memory array.

13. The RAM array of claim 11, wherein:
    the global bitlines comprise at least one read global bitline pair.

14. The RAM array of claim 11, further comprising:
    the global bitlines.

15. The RAM array of claim 14, wherein:
    each global bitline pair comprises a true read global bitline and a complement read global bitline.

16. The RAM array of claim 11, wherein:
    the local input/output logic comprises sense amplifier circuitry.

17. The RAM array of claim 11, further comprising:
    wordlines coupled to the memory cells.

18. The RAM array of claim 11, wherein:
    the bitlines comprise traces that are electrically tapped at array junctions where memory cells are placed within a memory bank.

19. The RAM array of claim 11, wherein:
    the memory banks are substantially co-planar, and the vertical direction is orthogonal to a plane defined by the memory banks.

20. The RAM array of claim 11, further comprising:
    a row address decoder.

* * * * *